United States Patent
Sundström (10) Patent No.: US 7,483,680 B2
(45) Date of Patent: Jan. 27, 2009

(54) METHOD AND APPARATUS FOR MODULATION PATH DELAY MISMATCH COMPENSATION IN A POLAR MODULATION TRANSMITTER

(75) Inventor: Lars Sundström, Lund (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 580 days.

(21) Appl. No.: 11/313,032

(22) Filed: Dec. 20, 2005

(65) Prior Publication Data

US 2007/0142005 A1 Jun. 21, 2007

(51) Int. Cl.
*H04B 1/04* (2006.01)
*H04B 17/00* (2006.01)

(52) U.S. Cl. ................. 455/126; 455/115.2; 455/125

(58) Field of Classification Search ............ 455/126, 455/91, 102, 108, 115.1, 115.2, 116, 125; 375/261, 195, 197, 300
See application file for complete search history.

(56) References Cited

U.S. PATENT DOCUMENTS

| | | | |
|---|---|---|---|
| 6,101,224 A | 8/2000 | Lindoff et al. | |
| 6,580,705 B1 | 6/2003 | Riazi et al. | |
| 6,650,875 B1 | 11/2003 | Rozenblit et al. | |
| 6,658,238 B1 | 12/2003 | Ursenbach et al. | |
| 6,734,724 B1 | 5/2004 | Schell et al. | |
| 6,750,710 B2 | 6/2004 | Ring et al. | |
| 6,885,241 B2 | 4/2005 | Huang et al. | |
| 6,903,619 B2 | 6/2005 | Dennis et al. | |
| 6,909,757 B2 | 6/2005 | Justice et al. | |
| 7,072,626 B2 * | 7/2006 | Hadjichristos | 455/126 |
| 7,183,844 B2 * | 2/2007 | Klomsdorf et al. | 330/129 |
| 7,359,680 B2 * | 4/2008 | Klemmer | 455/102 |
| 7,379,715 B2 * | 5/2008 | Udagawa et al. | 455/126 |
| 7,400,211 B2 * | 7/2008 | Lee et al. | 332/144 |
| 2003/0073419 A1 | 4/2003 | Chadwick | |
| 2003/0157905 A1 | 8/2003 | Holmqvist | |

(Continued)

FOREIGN PATENT DOCUMENTS

EP 1 056 248 A1 5/1999

(Continued)

OTHER PUBLICATIONS

McCune, E. Advanced Architectures for High Efficiency Multimode, Multi-band Terminal Power Amplifers. 2004. pp. 167-170. IEEE RAWCON.

(Continued)

*Primary Examiner*—Sonny Trinh
(74) *Attorney, Agent, or Firm*—Coats & Bennett, P.L.L.C.

(57) ABSTRACT

A polar modulation transmitter offers a split architecture for determining amplitude modulation path delay of the transmitter and comprises a split supply modulation circuit and a split power amplifier circuit. The split supply modulation circuit includes a common supply input and is configured to receive a common amplitude-modulation signal at respective signal inputs and output first and second modulated supply signals responsive to the common amplitude-modulation signal. The split power amplifier circuit includes first and second supply inputs each coupled to one of the respective modulated supply signals, first and second signal inputs and first and second outputs each responsive to the respective supply and signal inputs, the split power amplifier circuit being configured to receive a common phase-modulation signal at its signal inputs and combine its outputs to form a signal having amplitude modulations responsive to the common amplitude-modulation signal and phase modulations responsive to the common phase-modulation signal.

37 Claims, 6 Drawing Sheets

U.S. PATENT DOCUMENTS

| | | |
|---|---|---|
| 2003/0215025 A1 | 11/2003 | Hietala |
| 2003/0224740 A1 | 12/2003 | Takano et al. |
| 2003/0224743 A1 | 12/2003 | Okada et al. |
| 2004/0219891 A1* | 11/2004 | Hadjichristos .............. 455/102 |
| 2004/0247041 A1 | 12/2004 | Biedka et al. |
| 2005/0116785 A1 | 6/2005 | Harron et al. |
| 2005/0190854 A1* | 9/2005 | Shakeshaft et al. .......... 375/295 |
| 2006/0068725 A1* | 3/2006 | Zolfaghari .................. 455/126 |
| 2006/0255997 A1* | 11/2006 | Li et al. ...................... 341/156 |
| 2007/0152767 A1* | 7/2007 | Lee et al. .................... 332/112 |

FOREIGN PATENT DOCUMENTS

| | | |
|---|---|---|
| EP | 1035701 | 9/2000 |
| EP | 1 517 452 A2 | 4/2002 |
| EP | 1 517 452 A3 | 4/2002 |
| EP | 1 536 605 A1 | 11/2003 |
| JP | 06-046031 | 2/1994 |
| JP | 2004-356835 | 5/2003 |
| WO | WO 02/080484 A1 | 10/2002 |
| WO | WO 02/089435 A1 | 11/2002 |
| WO | WO 03/081870 A1 | 10/2003 |
| WO | WO 03/103162 A1 | 12/2003 |
| WO | WO 2004/045093 A1 | 5/2004 |
| WO | WO 2004/066489 A1 | 8/2004 |
| WO | WO 2004/084514 A1 | 9/2004 |
| WO | WO 2004/100483 A1 | 11/2004 |
| WO | WO 2004/110008 A1 | 12/2004 |
| WO | WO 2005/015756 A1 | 2/2005 |
| WO | WO 2005/031984 A2 | 4/2005 |

OTHER PUBLICATIONS

Barry, John R. et al. "Timing Recovery". *Digital Communication*. 2004. 25 pages. Third Edition. Kluwer Academic Publishers. Netherlands.

Hadjichristos, Aristotele. Transmit Architectures And Power Control Schemes Fro Low Cost Highly Integrated Transceivers for GSM/EDGE Applications. 2003. pp. III-610-III-613. IEEE.

McCune, E. and Sander, W. "Edge Transmitter Alternative Using Nonlinear Polar Modulation". 2003. pp. III-594-III-597. IEEE.

Sowlati, Tirdad et al. "Quad-Band GSM/GPRS/EDGE Polar Loop Transmitter". Dec. 2004. pp. 2179-2189. IEEE Journal of Solid-State Circuits. vol. 39. No. 12.

Sowlati, Tirdad et al. "Quad-Band GSM/GPRS/EDGE Polar Loop Transmitter". Dec. 2004. 10 pages. IEEE International Solid-State Circuits Conference Session 10.

Ditore, Frank. "Polar Modulation Ups Efficiency in Mobile PA Designs". Sep. 4, 2003. 8 pages. CommsDesign. URL:http://www.commsdesign.com/showArticle.jhtml?articleID=16502088.

* cited by examiner

METHOD AND APPARATUS FOR MODULATION PATH DELAY MISMATCH COMPENSATION IN A POLAR MODULATION TRANSMITTER

BACKGROUND OF THE INVENTION

The present invention generally relates to radio frequency (RF) transmitters, and particularly relates to RF polar modulation transmitters.

The advent of data-driven applications has spurred a paradigm shift from circuit-switched to packet-switched based wireless communication devices. To support burgeoning packet-switched applications, improved data transmission rates and spectrum efficiency have become increasingly important considerations when designing packet-based wireless communication networks and devices.

General Packet Radio Service (GPRS), a subsystem of the Global System for Mobile Communications standard (GSM), introduced packet-switched data into GSM networks. GPRS-compliant components use constant-amplitude modulation techniques such as Gaussian Minimum Shift Keying (GMSK) to provide phase modulated RF signals. A newer standard, known as Enhanced Data rates for GSM Evolution (EDGE), doubled the data-rate capability of GPRS for many wireless communication device functions such as e-mail, video cameras, and MP3 players. To accommodate this increased bandwidth while maximizing spectral efficiency, EDGE-compliant transmission components use non-constant amplitude modulation techniques such as 8-state Phase Shift Keying (8PSK) to provide RF signals having both phase and amplitude modulations.

Accurate phase and amplitude control are important aspects of achieving acceptable transmission signal characteristics in non-constant modulation applications such as EDGE for achieving acceptable performance. As a general principle, constant-envelope amplifiers are not suitable for linear amplification of the amplitude modulations present in non-constant envelope signals. More particularly, spectral performance requirements, such as minimization of Adjacent Channel Power (ACP) and the like, impose high linearity requirements on the circuits used for transmitting such signals.

Of course, transmission circuits biased for linear amplification may be used to amplify signals that include both phase and amplitude modulations. However, linearly biased power amplifiers do not operate as efficiently as those biased for saturated-mode operation. Within the context of this dilemma, "polar modulation" transmitter architectures benefit from the efficiency of saturated-mode power amplifier operation while offering potentially high linearity for amplitude modulation.

Polar transmitters operate separately on phase and amplitude modulation components of a signal. For example, processing logic maps digital data to be transmitted into temporally coordinated phase and amplitude modulation information. The phase modulation information is used to generate a constant-envelope signal for input to a saturated-mode power amplifier, and the amplitude modulation information is used to generate an amplitude-modulated supply signal for the saturated-mode power amplifier. That is, the power amplifier's output signal includes phase modulation information imparted by the phase modulation information in the constant-envelope signal applied to the amplifier's input and (linear) amplitude modulation information imparted by the amplitude-modulation supply signal applied to the amplifier's supply connection. This arrangement allows the power amplifier to produce linear amplitude modulations in its output signal despite being biased for saturated-mode operation.

However, because the amplitude and phase modulated components of a signal are processed by different circuit elements, timing alignment between the phase and amplitude modulation paths must be accurate to maintain signal quality. If the phase and amplitude modulation components are not properly time aligned when combined at the power amplifier, signal quality may become unacceptably degraded.

A path delay offset, or mismatch, between the amplitude and phase modulation paths within the polar modulation transmitter occurs as a result of several variables, such as bandwidth variations between the phase and amplitude modulation paths. The phase modulation path generally includes high-bandwidth radio frequency processing elements such as a phase or frequency locked loop for imparting phase modulations. The amplitude modulation path generally includes low-bandwidth processing elements such as a power regulator or driver for imparting amplitude modulations at the power amplifier output stage of the polar transmitter. Amplitude and phase modulation path delay differences, if not properly accounted for, can cause the amplitude and phase modulation information to arrive at the final output stage of a polar transmitter at different times. Left uncompensated, path delay mismatch may cause the transmitter to fail certain performance metrics such as modulation accuracy, e.g., Error Vector Magnitude (EVM) and signal spectrum spread (i.e., spectral quality). Further compounding the path delay mismatch problem is the tendency for the mismatch to vary in response to several factors such as temperature, component degradation, component operating stability (e.g., frequency stability), power supply variation, etc.

SUMMARY OF THE INVENTION

According to the methods and apparatus taught herein, one embodiment of a polar modulation transmitter comprises a split supply modulation circuit and a split power amplifier circuit. The split supply modulation circuit includes a common supply input and is configured to receive a common amplitude-modulation signal at respective signal inputs and output first and second modulated supply signals responsive to the common amplitude-modulation signal. The split power amplifier circuit includes separate supply inputs, each coupled to one of the respective modulated supply signals, and includes a common signal input configured to receive a common phase-modulation signal. That is, the split power amplifier circuit includes two power amplifiers, each amplifier receiving the same phase-modulation input signal but having its supply input modulated by a different one of the modulated supply signals. The respective outputs of the split power amplifier circuit are combined to form an output signal having amplitude modulations responsive to the common amplitude-modulation signal and phase modulations responsive to the common phase-modulation signal.

One embodiment of a method of analyzing modulation path delay mismatch in a polar modulation transmitter circuit comprises generating first and second modulated supply signals by injecting a differential test signal into signal inputs of a split supply modulation circuit. The first and second modulated supply signals are compared to recover a delayed version of the differential test signal for estimating an amplitude modulation path delay based on the delayed version of the differential test signal. In the context of such operation, the differential test signal may be impressed onto a "live" amplitude modulation signal, such that one half of the split supply modulation circuit receives the amplitude modulation signal plus the test signal while the other half receives the amplitude modulation signal minus the test signal.

Of course, the present invention is not limited to the above features and advantages. Those skilled in the art will recognize additional features and advantages upon reading the following detailed description, and upon viewing the accompanying drawings.

DETAILED DESCRIPTION OF THE INVENTION

Figure 1:
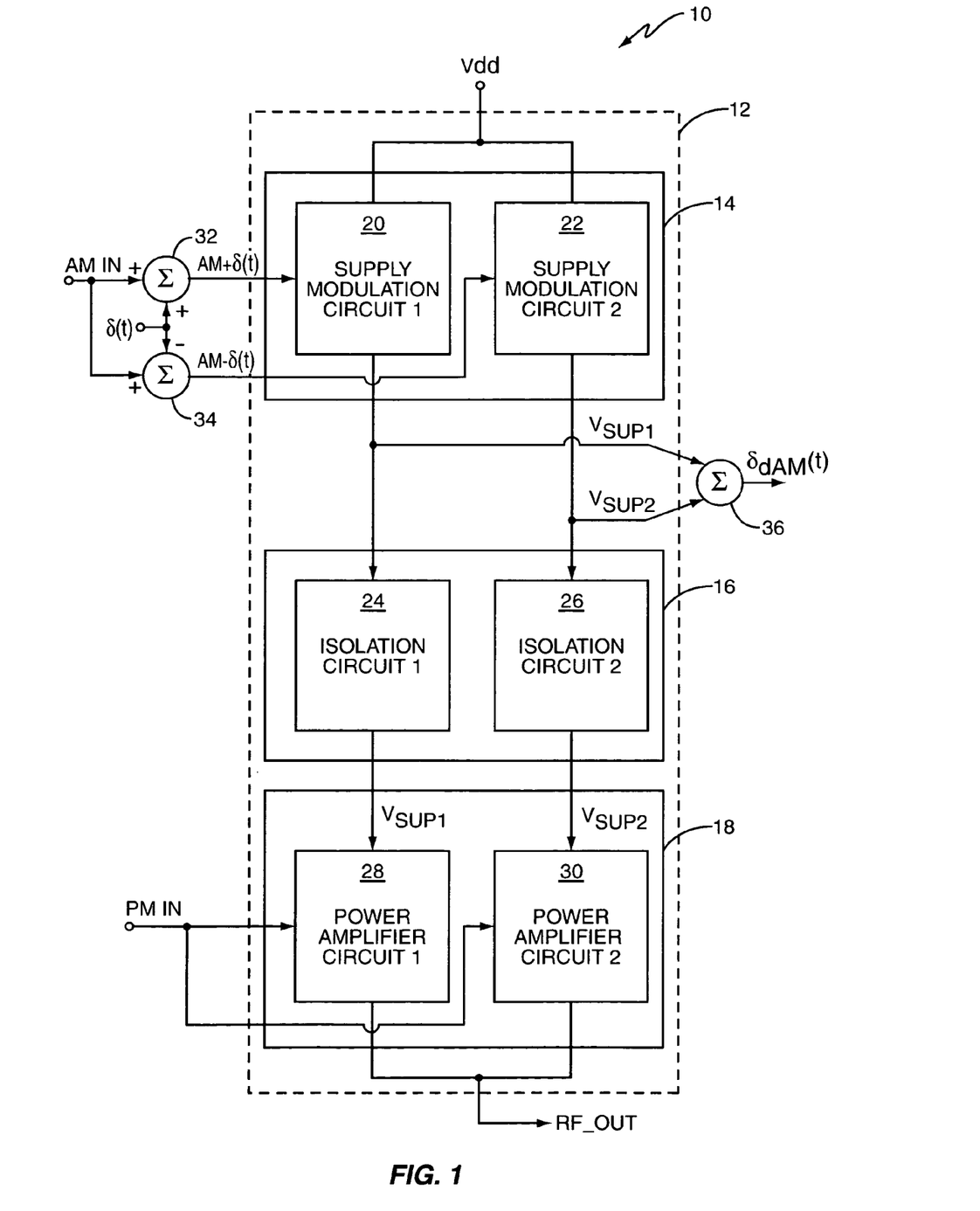
FIG. 1 is a block diagram of one embodiment of an output stage of a polar modulation transmitter.

FIG. 1 partially illustrates a polar modulation transmitter 10, which includes an embodiment of a "split" polar modulation output stage 12. In operation, the output stage 12 generates an RF output signal that includes phase modulations responsive to a phase-modulation signal (PM) and amplitude modulations responsive to an amplitude-modulation signal (AM). However, the split signal processing architecture of the output stage 12 enables accurate and relatively straightforward determination of amplitude modulation path delays, and further enables such determination to be done on-the-fly during live transmit operations, if desired, without degradation of the RF output signal. The output stage 12 includes nominally matched split signal processing paths formed by a split supply modulation circuit 14, a split isolation circuit 16, and a split power amplifier circuit 18.

The split signal processing paths provide a means for injecting a differential test signal ($\delta(t)$) into the output stage 12 for determining modulation path delay of the transmitter 10. An estimate of amplitude modulation path delay is calculated by comparing the differential test signal as injected into the split supply modulation circuit 14 with the test signal as it exits the split supply modulation circuit 14. The amplitude modulation path delay estimate is used to reduce modulation path delay mismatch of the transmitter 10.

Further, the split signal processing architecture effectively negates the effects of the differential test signal on the RF output signal of the transmitter 10 by combining the RF outputs of the split power amplifier circuit 18 to form the final RF output signal (RF_OUT). That is, by forming the final RF output signal as the combination of the split processing path signals, the differential components of the test signal tend to cancel, meaning that the test signal is effectively suppressed from the final RF output signal.

As a basis for understanding such operation, one sees that the split processing paths of the output stage 12 comprise nominally matched pairs of circuits. Particularly, the split supply modulation circuit 14 includes nominally matched first and second supply modulation circuits 20, 22. The split isolation circuit 16 includes nominally matched first and second isolation circuits 24, 26. The split power amplifier circuit 18 includes nominally matched first and second power amplifiers 28, 30.

The first supply modulation circuit 20 outputs a modulated supply signal ($V_{SUP1}$) having amplitude modulations corresponding to the amplitude-modulation signal AM. The second supply modulation circuit 22 outputs a modulated supply signal ($V_{SUP2}$) also having amplitude modulations corresponding to the amplitude-modulation signal AM. Absent differential test signal injection, the modulated supply signals $V_{SUP1}$ and $V_{SUP2}$ nominally are identical, assuming reasonably good matching between the supply modulation circuits 20, 22.

The split isolation circuit 16 isolates RF signals generated by the split power amplifier circuit 18 from the split supply modulation circuit 14. Particularly, the first isolation circuit 24 forms a high impedance path at RF frequencies between the first supply modulation circuit 20 and the first power amplifier 28. Likewise, the second isolation circuit 26 forms a high impedance path at RF frequencies between the second supply modulation circuit 22 and the second power amplifier 30. Because the modulated supply signals $V_{SUP1}$ and $V_{SUP2}$ are, in comparison to the RF frequencies of the RF_OUT signal, relatively low frequency signals, they pass essentially unimpeded from the split supply modulation circuit 14 to the split power amplifier circuit 18. Therefore, it is readily seen that the modulated supply signal $V_{SUP1}$ is also available between the first isolation circuit 24 and the first power amplifier 28 and the modulated supply signal $V_{SUP2}$ is also available between the second isolation circuit 26 and the second power amplifier 30.

The modulated supply signals $V_{SUP1}$ and $V_{SUP2}$ are received by the split power amplifier circuit 18 at respective supply input nodes. The first modulated supply signal $V_{SUP1}$ serves as a modulated supply signal applied to the first power amplifier 28, such that the output signal from the first power amplifier 28 includes phase modulations corresponding to the phase-modulation signal PM applied to its signal input and amplitude modulations corresponding to the amplitude-modulation signal AM as conveyed by $V_{SUP1}$. Similarly, the second modulated supply signal $V_{SUP2}$ serves as a modulated supply signal applied to the second power amplifier 30, such that the output signal from the second power amplifier 30 includes phase modulations corresponding to the phase-modulation signal PM applied to its signal input and amplitude modulations corresponding to the amplitude-modulation signal AM as conveyed by $V_{SUP2}$. The outputs of the power amplifiers 28, 30 are coupled at a common node to form the combined, final output signal (RF_OUT).

The split signal processing architecture of the output stage 12 is advantageous for amplitude modulation path delay determination because it allows a differential test signal ($\delta(t)$) to be injected into the split supply modulation circuit 14, such as by impressing it as a plus/minus signal on the amplitude-modulation signal AM. For example, $\delta(t)$ is impressed as a positive signal on AM by summer circuit 32 and impressed as a negative signal on AM by subtractor circuit 34. The differential test signal is recovered by subtracting the two modulated supply signals ($V_{SUP1}$ and $V_{SUP2}$), which are nominally matched but for the plus/minus test signal difference. For example, comparator 36 effectively subtracts $V_{SUP1}$ and $V_{SUP2}$ to recover the differential test signal.

The recovered test signal ($\delta_{dAM}(t)$) yields delay information associated with the split supply modulation circuit 14, which can then be used to adjust the relative timing of the amplitude-modulation signal AM and the phase-modulation signal PM to compensate for the delay. Preferably, the differential test signal has a bandwidth approximately less than or equal to that of the amplitude-modulation signal AM to minimize spectral leakage in those cases where the effects of the differential test signal on the RF output signal of the transmitter 10 are not completely negated by the split signal processing architecture of the transmitter 10.

Because the differential test signal causes a slight voltage mismatch between the $V_{SUP1}$ and $V_{SUP2}$ modulated supply signals applied to the power amplifiers 28, 30, the two power amplifiers 28, 30 have slightly different operating conditions and, therefore, slightly different gains. However, when the outputs of the power amplifiers 28, 30 are combined to form RF_OUT, the slightly offsetting gain components induced by the differential test signal are effectively cancelled. Therefore, the effective gain of the combined RF_OUT signal relative to the amplitude modulation signal AM is as desired.

Good component matching between the power amplifiers 28, 30 helps ensure that the desired gain is achieved. In general, the split processing paths of the output stage 12 include respective pairs of matched components, with respective sets of matched components forming each half of the split processing paths. For example, the first supply modulation circuit 20 is matched with the second supply modulation circuit 22, the first isolation circuit 24 is matched with the second isolation circuit 26, and so forth. Components are considered to "match" when they have relatively the same capability. Here, the term "capability" connotes the facility or potential for an indicated use or deployment. For example, capability may relate to gain, threshold voltage, current drive, frequency response, resistance, capacitance, inductance, or the like.

Those skilled in the art will appreciate that "matching" does not necessarily mean perfect correspondence, but rather means matching within acceptable ranges of tolerance and variation. As such, the term "matched components" as used herein connotes components having both identical capabilities as well as those having capabilities falling within an acceptable range of variance, where the acceptable range of variance is dependent upon a particular application in which the components are used.

Figure 2:
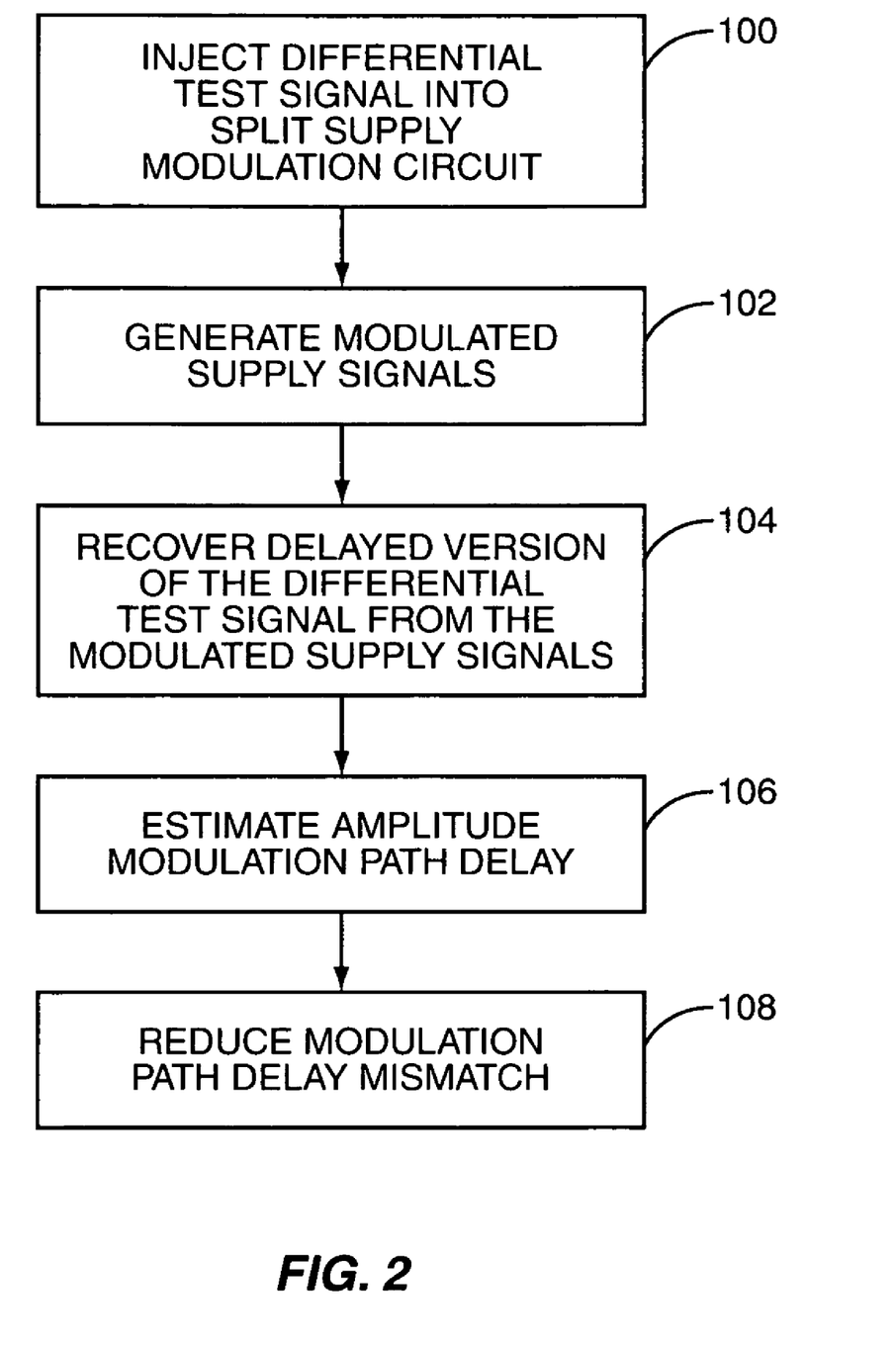
FIG. 2 is a logic flow diagram of one embodiment of processing logic for analyzing modulation path delay mismatch in a polar modulation transmitter.

With all of the above in mind, FIG. 2 illustrates corresponding program logic that may be implemented by the polar modulation transmitter 10 for determining modulation path delay mismatch. Processing "begins" with the injection of a differential test signal into the split supply modulation circuit 14 of the output stage 12 (Step 100) as previously described. The supply modulation circuits 20, 22 in the spilt supply modulation circuit 14 generate the modulated supply signals $V_{SUP1}$ and $V_{SUP2}$ (Step 102). These signals include the differential test signal. When the supply modulation circuits 20, 22 are sufficiently matched, the delay associated with the parallel processing paths of the split supply modulation circuit 14 is effectively equivalent ($t_{dAM}$). Thus, the differential test signal is subjected to approximately the same delay as it propagates through the parallel processing paths of the split supply modulation circuit 14.

Continuing with the program logic, a delayed version of the differential test signal is recovered by a comparator circuit 36 associated with or included in the polar modulation transmitter 10 (Step 104). For example, the comparator 36 is coupled to the outputs of the split supply modulation circuit 14 for comparing the first and second modulated supply signals $V_{SUP1}$ and $V_{SUP2}$. The comparison recovers a delayed version of the differential test signal ($\delta_{dAM}(t)$), where $\delta_{dAM}(t)$ corresponds to the differential test signal $\delta(t)$ delayed by $t_{dAM}$. the delay associated with the split supply modulation circuit 14. That is, recovery of the test signal after its passage through the split supply modulation circuit 14 provides a measured delayed test signal corresponding to the delay imparted by the split supply modulation circuit 14. Knowledge thus gained regarding that delay, which commonly is a significant component of the amplitude modulation path delay, may be used to compensate the relative timing of the amplitude-modulation and phase-modulation signals (AM and PM).

The delayed version of the differential test signal as recovered from the outputs of the split supply modulation circuit 14 is used to estimate the amplitude modulation path delay (Step 106). In turn, the estimated amplitude modulation path delay can be used to compensate for amplitude-to-phase path delay mismatch. That is, the relative timing between the generated AM and PM signals can be adjusted according to the estimated amplitude modulation path delay to compensate for the differences in amplitude and phase modulation path delays.

As is detailed later herein, in one embodiment, the estimate of amplitude modulation path delay is performed according to an open-loop process, and, in another embodiment, the estimate of amplitude modulation path delay is performed according to a closed-loop process. In the open-loop process, the AM-to-PM timing is adjusted according to the estimated amplitude modulation path delay, as measured from the injected-to-recovered differential test signal delay. In the closed-loop process, the AM-to-PM timing is adjusted under closed-loop control to minimize the difference between a compensation delay (or a delay offset) used to alter the AM-to-PM timing and the estimated amplitude modulation path delay. As such, the closed-loop process does not have to rely on an accurate amplitude modulation path delay estimate. Both the open-loop and closed-loop processes can, for example, adjust the AM-to-PM timing over time, e.g., by running continuously or at predetermined intervals.

In any case, the program logic continues with the polar modulation transmitter 10 using the amplitude modulation path delay estimate to reduce the modulation path delay mismatch within the transmitter 10 (Step 108). The modulation path delay mismatch is reduced by adjusting the compensation delay—i.e., the relative generation timing—used by the amplitude and phase modulation signal generators, respectively. The polar modulation transmitter 10 may implement one or more functions of the program logic either digitally, e.g., by converting analog signals to digitized signals and processing the digitized signals accordingly, with analog circuitry, or some combination of both, as explained further below. Notably, as mentioned earlier herein, an advantage of the split processing path architecture of the output stage 12 is that the delayed version of the differential test signal is recovered by the comparator circuit 36 without adversely affecting functional operation of the transmitter 10.

Figure 3:
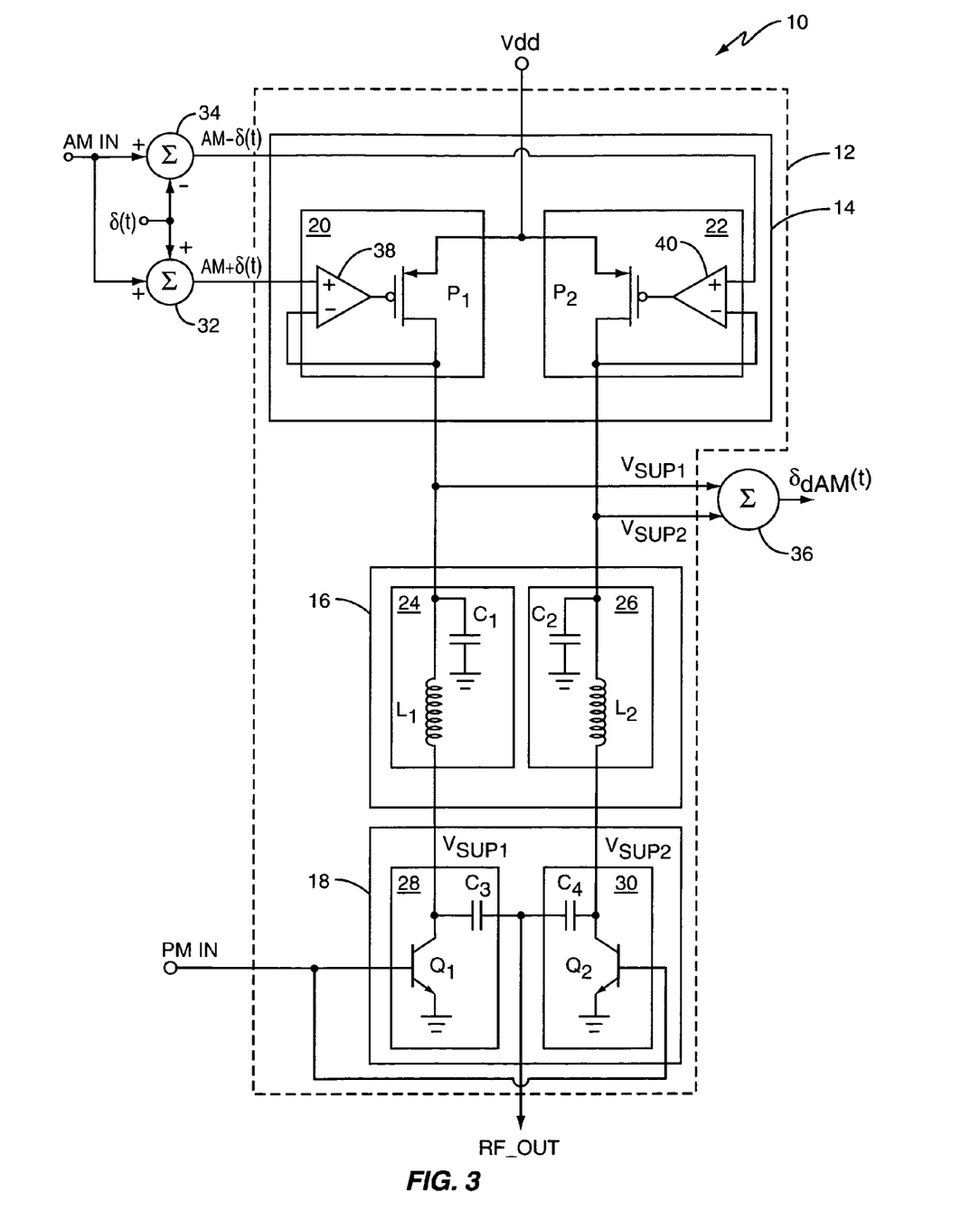
FIG. 3 is a circuit diagram of one embodiment of an output stage of a polar modulation transmitter.

In better understanding that and other advantages of the output stage 12, FIG. 3 illustrates details for one embodiment of the output stage 12, wherein, the first supply modulation circuit 20 of the split modulation supply circuit 14 includes a first amplifier 38 and a transistor P1, and the second supply modulation circuit 22 includes a second amplifier 40 and a transistor P2. The first amplifier 38 and transistor P1 form a linear regulator for generating the modulated supply signal $V_{SUP1}$. Likewise, the second amplifier 40 and transistor P2 form a linear regulator for generating the modulated supply signal $V_{SUP2}$. Broadly, the supply modulation circuits 20, 22 may comprise any suitable regulation circuits. Thus, while a linear regulator configuration is illustrated, it should be understood that, for example, the supply modulation circuits 20, 22 may be configured as switched regulators—i.e., Class D amplifiers.

Continuing with the ordered discussion, the first isolation circuit 24 includes capacitor C1 and inductor L1. Capacitor C1 and inductor L1 form a high impedance path at RF frequencies for isolating the RF output of the first power amplifier 28 from the first supply modulation circuit 20. Likewise, the second isolation circuit 26 includes capacitor C2 and inductor L2. Capacitor C2 and inductor L2 form a high impedance path at RF frequencies for isolating the RF output of the second power amplifier 30 from the second supply modulation circuit 22.

Turning to the split power amplifier circuit 18, the first power amplifier 28 includes transistor Q1 and capacitor C3 and the second power amplifier 30 includes transistor Q2 and capacitor C4. The modulated supply $V_{SUP1}$ serves as a modulated supply signal applied to the collector of transistor Q1, such that the output signal from Q1's collector includes phase modulations corresponding to the phase-modulation signal PM applied to its input (base) and amplitude modulations corresponding to the amplitude-modulation signal AM as conveyed by $V_{SUP1}$. Similarly, the modulated supply $V_{SUP2}$ serves as a modulated supply signal applied to the collector of transistor Q2, such that the output signal from Q2's collector includes phase modulations corresponding to the phase-modulation signal PM applied to its input (base) and amplitude modulations corresponding to the amplitude-modulation signal AM as conveyed by $V_{SUP2}$.

Capacitors C3 and C4 respectively couple the output signals from Q1 and Q2 to a common node. With this configuration, the final output signal (RF_OUT) is a summation of the output signals from the power amplifiers 28, 30. Except for test signal induced differences, the output signal from transistor Q1 is nominally the same as the output signal from Q2, assuming reasonably good matching between the Q1 and Q2 transistors and matched generation of $V_{SUP1}$ and $V_{SUP2}$ by the split supply modulation circuit 14. Although the gain of transistors Q1 and Q2 is slightly different when a differential test signal is injected into the output stage 12, combining the outputs of Q1 and Q2 to form RF_OUT effectively negates the effects of the differential test signal on the final RF output signal.

Figure 4:
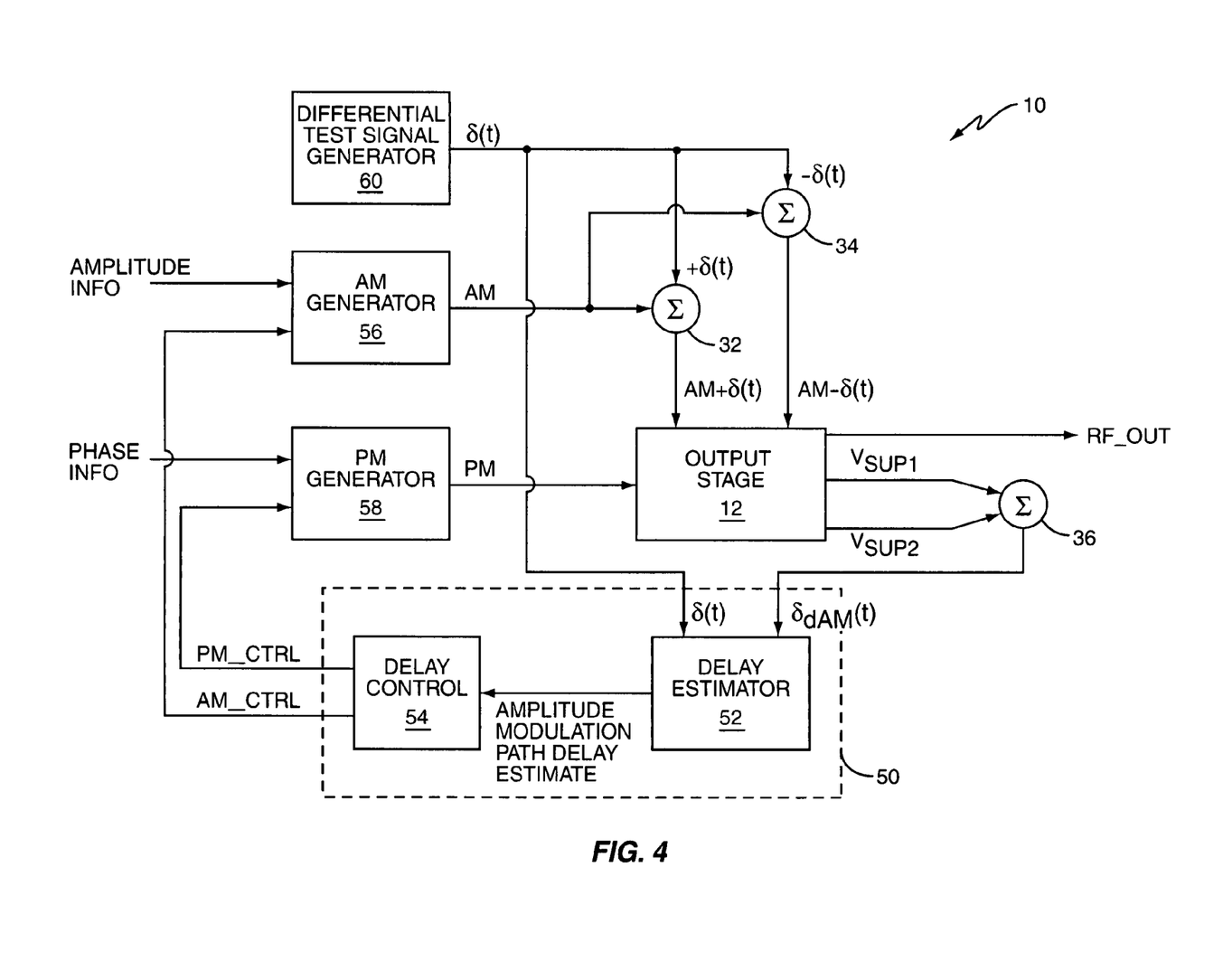
FIG. 4 is a block diagram of one embodiment of a polar modulation transmitter.

FIG. 4 is a block diagram of an embodiment of the polar modulation transmitter 10 including an open-loop circuit arrangement 50. The open-loop circuit arrangement 50 is configured to estimate the amplitude modulation path delay of the output stage 12 and generate one or more control signals responsive to the amplitude modulation path delay estimate. The control signals are used by the polar modulation transmitter 10 to reduce the modulation path delay mismatch of the transmitter 10. For example, the modulation path delay mismatch is reduced by adjusting the relative timing of the amplitude-modulation AM and phase-modulation PM signals responsive to the control signals. In at least one embodiment, the relative timing of the amplitude-modulation and phase-modulation signals are adjusted by modifying the compensation delay imparted on the AM and PM signals by amplitude and phase modulation signal generators 56, 58, respectively.

To that end, the open-loop circuit arrangement 50 includes a delay estimator 52 configured to estimate the amplitude modulation path delay of the output stage 12. The amplitude modulation path delay estimate is determined as a function of the difference between the measured delayed test signal ($\delta_{dAM}(t)$) and the differential test signal ($\delta(t)$). The delay estimator 52 compares the measured delayed test signal and the differential test signal to provide a raw estimate of the amplitude modulation path delay to a delay control circuit 54.

The delay control circuit 54 receives the amplitude modulation path delay estimate and generates control signals (AM_CTRL and PM_CTRL) responsive to the estimate. The control signals are provided to the amplitude modulation generator 56 and the phase modulation generator 58, respectively, to reduce the modulation path delay mismatch of the transmitter 10 by controlling the relative timing of the amplitude-modulation and phase-modulation signals. As such, the modulation generators 56, 58 are configured to adjust a delay offset between the amplitude-modulation and phase-modulation signals. Specifically, the modulation generators 56, 58 delay one of the modulation signals. Alternatively, the modulation generators 56, 58 adjust or advance one of the modulation signals. As a result, the amplitude-modulation signal component AM generated by the amplitude modulation generator 56 and the phase-modulation signal component PM generated by the phase modulation generator 58 are aligned in time such that the RF output signal of the transmitter 10 is modulated by phase and amplitude signals having an acceptable delay mismatch. As such, the RF output signal of the transmitter 10 is more likely to satisfy performance metrics such as EVM and signal spectrum spread.

The delay estimator 52 and the delay control circuit 54 may be implemented digitally, for example, as hardware, software or firmware embedded in a digital processing circuit such as a baseband/system processor of a wireless communication device. Alternatively, the delay estimator 52 and the delay control circuit 54 may be implemented using analog circuitry, for example, as a comparator, or implemented using some combination of analog and digital components.

Optionally, the polar modulation transmitter 10 further includes a differential test signal generator 60 for generating the differential test signal. In a non-limiting example, the differential test signal generator 60 is included in a built-in self-test circuit of the transmitter 10. Alternatively, the amplitude modulation generator 56 is configured to include a test signal generation function. As such, the amplitude modulation generator 56 directly injects the differential test signal into the amplitude-modulation signal AM as it is generated. In another non-limiting example, the differential test signal generator 60 is located externally to the transmitter 10, for example, as part of an external tester. During normal functional operation of the polar modulation transmitter 10, the differential test signal generator 60 superimposes a differential test signal on the common amplitude-modulation signal AM. Particularly, a first component of the differential test signal (+δ(t)) is superimposed on the amplitude-modulation signal component AM by a summer circuit 32 and the equal and opposite component of the differential test signal (−δ(t)) is superimposed on the amplitude-modulation signal component AM by a subtractor circuit 34.

Figure 5:
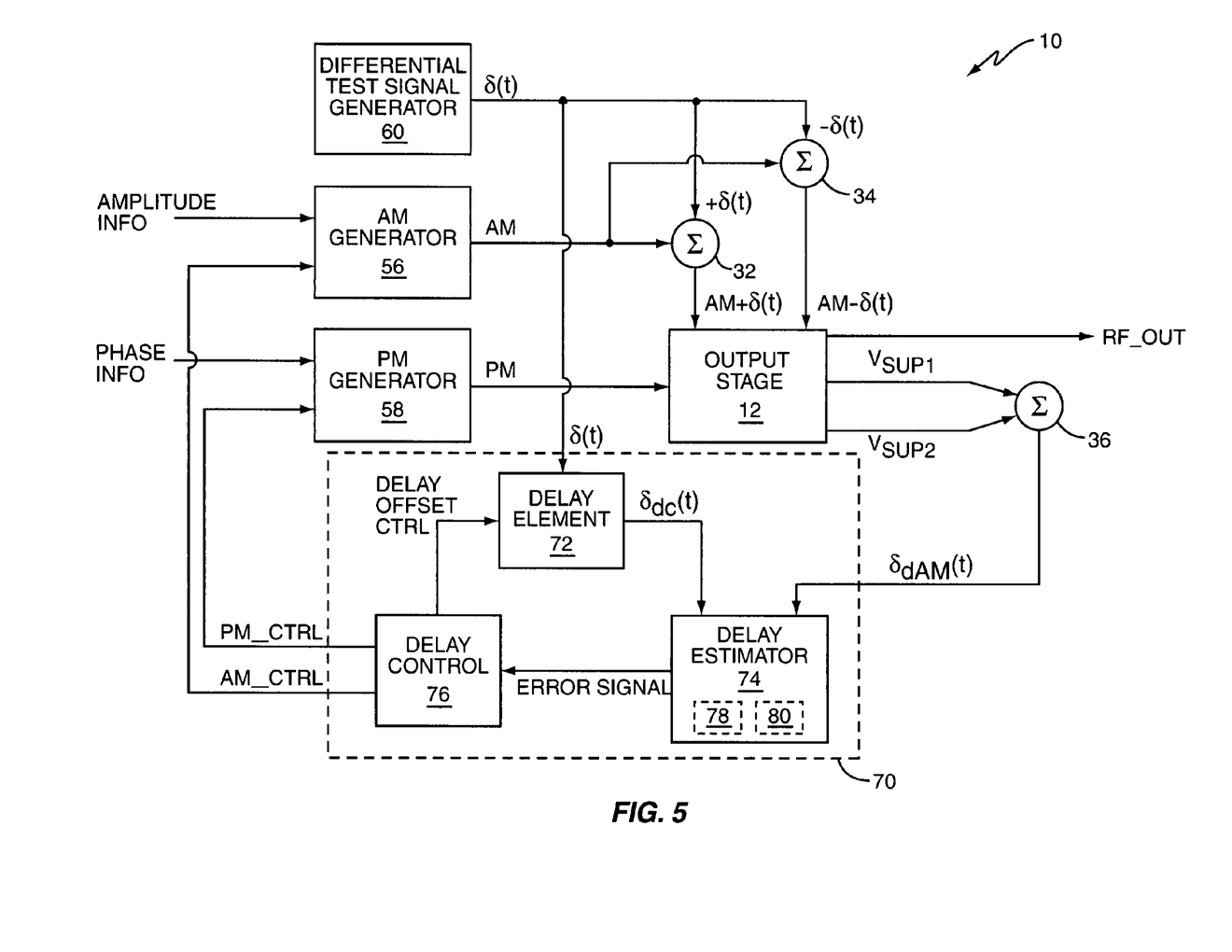
FIG. 5 is a block diagram of another embodiment of a polar modulation transmitter.

FIG. 5 is a block diagram of an embodiment of the polar modulation transmitter 10 including a closed-loop circuit arrangement 70. Similar to the open-loop circuit arrangement 50, the closed-loop arrangement 70 is used by the polar modulation transmitter 10 to reduce the modulation path delay mismatch of the transmitter 10. However, the closed-loop circuit arrangement 70 uses closed loop control to minimize the error between the compensation delay the transmitter 10 uses to adjust the relative timing of the AM and PM signals and the actual (measured) test signal delay. Regardless, the relative timing of the AM and PM signals are adjusted similarly to the open-loop arrangement. That is, the modulation generators 56, 58 are configured by the closed-loop circuit arrangement 70 to adjust the relative timing of the amplitude-modulation and phase-modulation signals to reduce the modulation path delay mismatch of the transmitter 10.

More particularly, a variable delay element 72 delays the differential test signal (δ(t)) by an amount of time ($t_{dc}$) corresponding to the delay offset currently in place between the modulation generators 56, 58 to obtain a delayed test signal $δ_{dc}(t)$. A delay estimator 74 compares the measured delayed test signal as measured via the comparator 36, for example, with the delayed test signal generated by the variable delay element 72. The delay estimator 74 generates an error signal having a polarity corresponding to the delay difference between the measured delayed test signal ($δ_{dAM}(t)$) as recovered from the modulated supply signals and the delayed test signal ($δ_{dc}(t)$), i.e., the output of the variable delay element 72. For example, the error signal is positive if $t_{dAM} > t_{dc}$, negative if $t_{dAM} < t_{dc}$, or zero if $t_{dAM} \approx t_{dc}$, where $t_{dAM}$ denotes the delay associated with the split supply modulation circuit 14 and $t_{dc}$ denotes the delay associated with the variable delay element 72. Alternatively, the delay estimator 74 generates an error signal corresponding to a nonlinear, but monotonic function of the actual delay, e.g., the error signal increases with delay, but not proportionally to the delay.

In turn, a delay control circuit 76 varies the delay imparted by the variable delay element 72 to minimize the error signal using a delay offset control signal that indicates whether the variable delay element 72 should increase the delay it imparts on the differential test signal, decrease it, or do nothing. The delay offset control signal is adjusted by the delay control circuit 76 until the closed-loop circuit arrangement 70 locks onto the amplitude modulation path delay of the output stage 12. When the feedback output of the variable delay element 72 matches the measured delayed test signal or is within an acceptable tolerance, the closed-loop circuit arrangement 70 has "locked" onto the amplitude modulation path delay.

With such operation, the closed-loop circuit arrangement 70 matches the compensation delay value it uses to adjust the relative AM and PM signal generation to the delay value measured for the differential test signal. Thus, if the amplitude modulation path delay fluctuates or otherwise changes over time, such as due to temperature, the closed-loop circuit arrangement 70 will adjust the timing relationship between the modulation generators 56, 58 accordingly. The closed-loop circuit arrangement 70 may be implemented digitally, for example, as hardware, software or firmware embedded in a digital processing circuit such as a baseband/system processor of a wireless communication device. Alternatively, the closed-loop circuit arrangement 70 may be implemented using analog circuitry, or some combination of analog and digital components.

In a non-limiting example wherein the differential test signal is sinusoidal, the delay estimator 74 includes an error detector 78. The error detector 78 generates an output having a polarity corresponding to the delay difference between the measured delayed sinusoidal differential test signal as recovered from the modulated supply signals and the delayed sinusoidal test signal as the feedback output from the variable delay element 72.

The delay estimator 74 further includes a loop filter 80. The loop filter 80 forms the error signal by smoothing the output of the error detector 78. For example, the loop filter 80 smooths the output of the error detector 78 into a voltage signal, which in turn is provided to the delay control circuit 76 for processing as previously described. Alternatively, the loop filter 80 functions as a voltage storage device. When configured as a voltage storage device, the error detector 78 charges (or discharges) the storage device until a sufficient error (e.g., voltage) signal is generated to put the closed-loop circuit arrangement 70 back into a "locked" condition.

In greater detail, the error detector 78 includes a comparator (not shown) configured to detect a phase difference between the measured delayed sinusoidal differential test signal and the sinusoidal feedback output of the variable delay element 72. The error detector 78 further includes a charge pump (not shown) configured to output source/sink current pulses to the loop filter 80 in response to the phase difference detected by the comparator. The loop filter 80 smooths the source/sink current pulses received from the charge pump to generate the error signal as previously described.

Broadly, the differential test signal may be any random, pseudo-random, or deterministic wideband signal known to the transmitter 10. As such, the delay estimator 52 associated with FIG. 4 and/or the delay estimator 74 associated with FIG. 5 are capable of implementing the appropriate correlation function to estimate the delay difference between the measured delayed test signal ($δ_{dAM}(t)$) and the differential test signal (δ(t)), or the delay difference between the measured delayed test signal ($δ_{dAM}(t)$) and the delayed test signal ($δ_{dc}(t)$). Regardless of the form of the differential test signal, the magnitude of the signal is preferably relatively small compared to that of amplitude-modulation signal AM. As such, the differential test signal will have little impact on the functional operation of the transmitter 10 even if the split processing paths are not perfectly matched.

Figure 6:
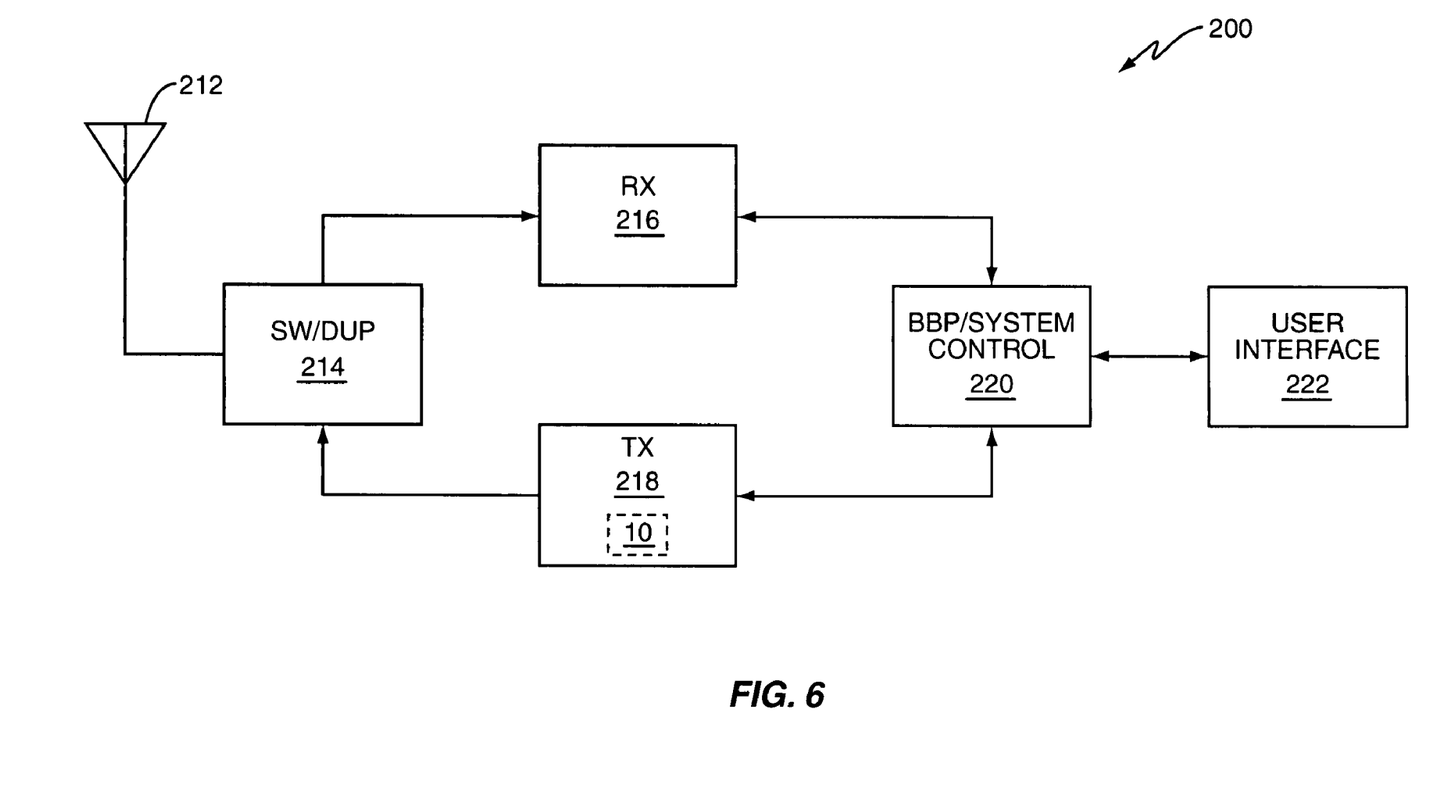
FIG. 6 is a simplified block diagram of a wireless communication device incorporating an embodiment of a polar modulation transmitter according to the methods and apparatus taught herein.

FIG. 6 illustrates a wireless communication device 200, such as a pager, mobile handset, PDA, handheld computer, or other type of communication device or system. The device 200 includes one or more antennas 212 and an associated switch (and/or duplexer) circuit 214 that is coupled to a receiver 216 and a transmitter 218. The device 200 further includes a baseband/system processor 220 that comprises one or more microprocessors or other processing circuits, and a user interface 222.

The transmitter 218 includes the polar modulation transmitter 10. For example, where the device 200 is a cellular handset intended for packet-based, high bandwidth data applications, it may be advantageous to include the polar modulation transmitter 10 in the transmitter 218 of the device 200 to minimize modulation path delay mismatch within the transmitter 218. To that end, the polar modulation transmitter 10 may be included entirely within the transmitter 218 of the device 200 as illustrated in FIG. 6 wherein the RF output signal of the polar modulation transmitter 10 is provided to the one or more antennas 212 for transmission over the air. As such, modulation path delay mismatch reduction as described herein, for example, the open-loop teachings of FIG. 4 or the closed-loop teachings of FIG. 5, are implemented entirely within the transmitter 218 of the device 200.

Alternatively, components of the polar modulation transmitter 10 are dispersed throughout the several components of the device 200. A non-limiting example provides for the inclusion of the output stage 12 of the polar modulation transmitter 10 in the transmitter 218 of the device 200. To that end, the baseband/system processor 220 includes hardware and/or software-based logic to reduce the modulation delay mismatch of the output stage 12 as previously discussed. For example, the baseband/system processor 220 includes hardware and/or software-based logic configured to reduce the modulation delay mismatch of the output stage 12 in accordance with the open-loop arrangement associated with FIG. 4 or the closed-loop arrangement associated with FIG. 5. Furthermore, the baseband/system processor 220 includes the modulation generators 56, 58 for generating amplitude and phase modulated signal components, respectively. Particularly, the amplitude modulation generator 56 generates the amplitude-modulation signal component AM in response to amplitude information received by it (AMPLITUDE INFO) as illustrated in FIGS. 4 and 5. Additionally, the phase modulation generator 56 generates the phase-modulation signal component PM in response to phase information received by it (PHASE INFO) also as illustrated in FIGS. 4 and 5. As such, the baseband/system processor 220 is configured to generate amplitude and phase modulation signal components that are aligned in time such that the RF output signal of the output stage 12 is modulated by phase and amplitude signals having acceptable delay mismatch so to avoid EVM and/or signal spectrum spread induced failures.

With the above range of variations and applications in mind, it should be understood that the present invention is not limited by the foregoing description, nor is it limited by the accompanying drawings. Instead, the present invention is limited only by the following claims, and their legal equivalents.

What is claimed is:

1. A method of analyzing modulation path delay mismatch in a polar modulation transmitter circuit comprising:
   generating first and second modulated supply signals by injecting a differential test signal into signal inputs of a split supply modulation circuit; and
   comparing the first and second modulated supply signals to recover a delayed version of the differential test signal for estimating an amplitude modulation path delay based on the delayed version of the differential test signal.

2. The method of claim 1, wherein injecting a differential test signal into the signal inputs of the split supply modulation circuit comprises forming a first supply modulation signal for input to a first one of the supply modulation circuit signal inputs by adding a test signal to an amplitude-modulation signal, and forming a second supply modulation signal for input to a second one of the supply modulation circuit signal inputs by subtracting the test signal from the amplitude-modulation signal.

3. The method of claim 2, further comprising:
   applying the first modulated supply signal to a supply input of a first power amplifier;
   applying a phase-modulation signal to a signal input of the first power amplifier;
   applying the second modulated supply signal to a supply input of a second power amplifier;
   applying the phase-modulation signal to a signal input of the second power amplifier; and
   combining outputs of the first and second power amplifiers to generate an output signal having amplitude modulations corresponding to the amplitude-modulation signal and phase modulations corresponding to the phase-modulation signal.

4. The method of claim 3, wherein combining the outputs of the first and second power amplifiers to generate the output signal comprises coupling the outputs of the first and second power amplifiers to negate the effect of the differential test signal on the output signal.

5. The method of claim 2, wherein a bandwidth of the differential test signal is less than or equal to a bandwidth of the amplitude-modulation signal.

6. The method of claim 2, wherein the differential test signal comprises one of a known random, pseudo-random, and deterministic wideband signal having a bandwidth less than or equal to a bandwidth of the amplitude-modulation signal.

7. The method of claim 1, wherein comparing the first and second modulated supply signals to recover a delayed version of the differential test signal comprises subtracting the second modulated supply signal from the first modulated supply signal.

8. The method of claim 1, wherein comparing the first and second modulated supply signals to recover a delayed version of the differential test signal comprises:
   converting the first and second modulated supply signals to respective first and second digitized signals; and
   processing the digitized signals to recover a digital representation of the delayed version of the differential test signal.

9. The method of claim 8, wherein processing the digitized signals to recover the digital representation of the delayed version of the differential test signal comprises correlating the digital representations of the first and second modulated supply signals.

10. The method of claim 1, wherein injecting the differential test signal into the signal inputs of the split supply modulation circuit comprises injecting the differential test signal during functional operation of the polar modulation transmitter circuit.

11. The method of claim 1, further comprising estimating the amplitude modulation path delay based on the delayed version of the differential test signal.

12. The method of claim 11, further comprising providing one or more control signals based on the amplitude modulation path delay estimate to one or more of an amplitude modulation circuit and a phase modulation circuit for reducing the modulation path delay mismatch of the polar modulation transmitter circuit.

13. The method of claim 12, further comprising reducing the modulation path delay mismatch of the polar modulation transmitter circuit by adjusting one or more timing relationships between the amplitude and phase modulation circuits responsive to the one or more control signals.

14. The method of claim 11, wherein estimating the amplitude modulation path delay based on the delayed version of the differential test signal comprises comparing the delayed version of the differential test signal with the differential test signal.

15. The method of claim 11, wherein estimating the amplitude modulation path delay based on the delayed version of the differential test signal comprises:
   converting the first and second modulated supply signals to respective first and second digitized signals;
   processing the digitized signals to recover a digital representation of the delayed version of the differential test signal; and
   comparing the digital representation of the delayed version of the differential test signal with a digital representation of the differential test signal.

16. The method of claim 11, wherein estimating the amplitude modulation path delay based on the delayed version of the differential test signal comprises:
   forming a feedback signal by delaying the differential test signal by a delay offset;
   generating an error signal by comparing the feedback signal with the delayed version of the differential test signal; and
   adjusting the delay offset to reduce the error signal.

17. The method of claim 16, wherein the differential test signal comprises a sinusoidal signal and generating an error signal by comparing the feedback signal with the delayed version of the differential test signal comprises determining a phase difference between the feedback signal and the delayed version of the differential test signal.

18. A polar modulation transmitter circuit, comprising:
a split supply modulation circuit having a common supply input, the split supply modulation circuit configured to receive a common amplitude-modulation signal at respective signal inputs and output first and second modulated supply signals responsive to the common amplitude-modulation signal; and
a split power amplifier circuit having a first supply input coupled to one of the modulated supply signals, a second supply input coupled to the other modulated supply signal, a first signal input, a second signal input, a first output responsive to the first supply and signal inputs and a second output responsive to the second supply and signal inputs, the split power amplifier circuit configured to receive a common phase-modulation signal at the first and second signal inputs and to combine the first and second outputs of the split power amplifier circuit to form a signal having amplitude modulations responsive to the common amplitude-modulation signal and phase modulations responsive to the common phase-modulation signal.

19. The polar modulation transmitter circuit of claim 18, wherein split processing paths of the split modulation circuit are matched so that the first and second modulated supply signals are substantially equivalent.

20. The polar modulation transmitter circuit of claim 18, wherein split processing paths of the split power amplifier circuit are matched so that signals formed at the first and second outputs of the split power amplifier circuit are substantially equivalent.

21. The polar modulation transmitter circuit of claim 18, further comprising a comparator circuit configured to receive the first and second modulated supply signals and output a measured delayed test signal corresponding to a difference between the first and second modulated supply signals.

22. The polar modulation transmitter circuit of claim 21, wherein the split supply modulation circuit is further configured to receive a differential test signal at the respective signal inputs of the split supply modulation circuit and output the first and second modulated supply signals responsive to the common amplitude-modulation signal and the differential test signal.

23. The polar modulation transmitter circuit of claim 22, further comprising a delay estimation circuit configured to provide an amplitude modulation path delay estimate of the polar modulation transmitter circuit based on the measured delayed test signal.

24. The polar modulation transmitter circuit of claim 23, wherein the delay estimation circuit is configured to provide the amplitude modulation path delay estimate by comparing the measured delayed test signal with the differential test signal.

25. The polar modulation transmitter circuit of claim 24, wherein the delay estimation circuit comprises firmware embedded in a digital processing circuit of a wireless communication device.

26. The polar modulation transmitter circuit of claim 23, further comprising a delay control circuit configured to provide one or more control signals based on the amplitude modulation path delay estimate to one or more of an amplitude modulation circuit and a phase modulation circuit for adjusting a timing relationship between the modulation circuits to reduce modulation path delay mismatch of the polar modulation transmitter.

27. The polar modulation transmitter circuit of claim 22, further comprising:
a delay circuit configured to generate a delayed test signal by imparting a compensation delay to the differential test signal; and
a delay estimation circuit configured to provide an error signal corresponding to a delay difference between the delayed test signal and the measured delayed test signal.

28. The polar modulation transmitter circuit of claim 27, wherein the differential test signal is sinusoidal and the delay estimation circuit comprises a phase detection circuit configured to provide the error signal by determining a phase difference between the delayed test signal and the measured delayed test signal.

29. The polar modulation transmitter circuit of claim 27, further comprising a delay control circuit configured to adjust the compensation delay so that the delayed test signal matches the measured delayed test signal.

30. The polar modulation transmitter circuit of claim 29, wherein the delay control circuit is further configured to adjust the relative timing of the common amplitude-modulation and phase-modulation signals based on the compensation delay.

31. The polar modulation transmitter circuit of claim 22, further comprising a signal generator included in the polar modulation transmitter for generating the differential test signal.

32. A wireless communication device comprising the polar modulation transmitter circuit of claim 18.

33. The polar modulation transmitter circuit of claim 18, wherein the split supply modulation circuit comprises split signal processing paths, wherein each path comprises a supply modulation circuit configured to modulate the common supply input responsive to the common amplitude-modulation signal and generate one of the modulated supply signals.

34. The polar modulation transmitter circuit of claim 33, wherein the supply modulation circuits are matched.

35. The polar modulation transmitter circuit of claim 33, wherein the supply modulation circuits each comprise a linear regulator configured to modulate the common supply input responsive to the common amplitude-modulation signal and generate one of the modulated supply signals.

36. The polar modulation transmitter circuit of claim 18, wherein the split power amplifier circuit comprises split signal processing paths, wherein each path comprises a power amplifier having a supply input configured to receive one of the modulated supply signals, a signal input configured to receive the common phase-modulation signal, and an output configured to provide a signal having amplitude modulations responsive to the modulated supply signal coupled to the respective supply input and phase modulations responsive to the common phase-modulation signal.

37. The polar modulation transmitter circuit of claim 36, wherein the power amplifiers are matched.

* * * * *